Figure 1:
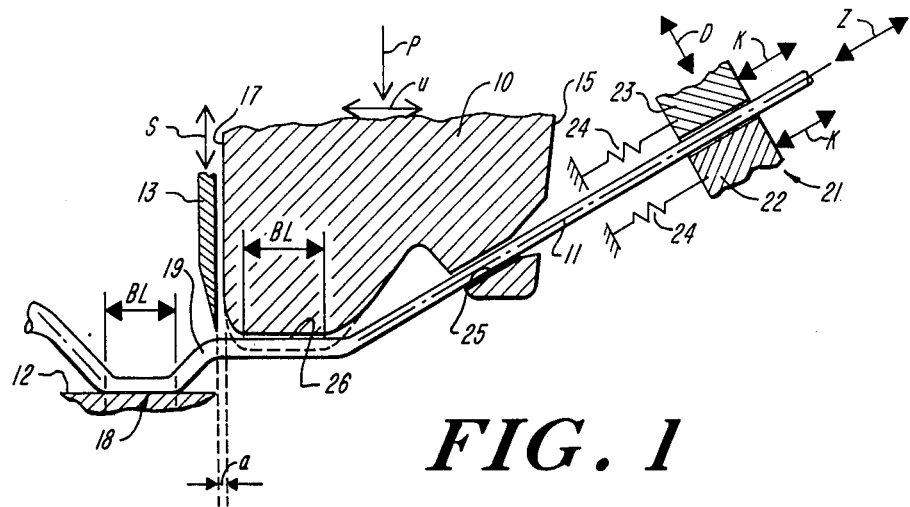

United States Patent [19]

Urban

[11] Patent Number: 4,619,397

[45] Date of Patent: Oct. 28, 1986

[54] METHOD OF AND APPARATUS FOR BONDING AN ELECTRICALLY CONDUCTIVE WIRE TO BONDING PADS

[76] Inventor: Peter Urban, Gärtnerstr. 44, Kolbermoor/BRD, Fed. Rep. of Germany

[21] Appl. No.: 677,189

[22] Filed: Dec. 3, 1984

[30] Foreign Application Priority Data

Dec. 2, 1983 [DE] Fed. Rep. of Germany ....... 3343738

[51] Int. Cl.$^4$ ..................... B23K 20/10; B23K 31/02
[52] U.S. Cl. .................................. 228/111; 156/73.2; 156/580.1; 228/1.1; 228/4.5; 228/13
[58] Field of Search ................ 156/73.2, 580.1, 580.2; 228/110, 1.1, 904, 4.5, 13, 111

[56] References Cited

U.S. PATENT DOCUMENTS

| | | | |
|---|---|---|---|
| 3,444,612 | 5/1969 | Pennings | 228/110 |
| 3,627,192 | 12/1971 | Killingsworth | 228/1.1 |
| 3,659,770 | 5/1972 | Miller | 228/1.1 |
| 3,747,198 | 7/1973 | Benson et al. | 228/1.1 |

FOREIGN PATENT DOCUMENTS 2247581 4/1974 Fed. Rep. of Germany .

*Primary Examiner*—Michael Wityshyn
*Attorney, Agent, or Firm*—Pahl, Lorusso & Loud

[57] ABSTRACT

A method and an apparatus for bonding a thin electrically conductive wire, especially an aluminum wire (11), to electrical bonding pads or areas (12, 14) of electric or electronic components (16), especially microchips or semiconductor components. To this end the wire (11) is briefly pressed against the bonding pad (12, 14) by means of an ultrasonically energized bonding wedge (10) and is subsequently severed at a small distance from the side (17) of the wedge (10) that is opposite to the wire feeding side (15) thereof. To prevent the formation of a wire tail (TL) protruding beyond the bonding length (BL), a wire clamping tool (21) is provided on the wire feeding side of the wedge (10) by means of which the wire (11), after having been severed and prior to another bonding operation, is moved back, preferably retracted, at least to such an extent that the free wire end is approximately flush with the side (17) of the wedge (10) which is opposite to the wire feeding side (15) thereof.

7 Claims, 2 Drawing Figures

U.S. Patent    Oct. 28, 1986    4,619,397

METHOD OF AND APPARATUS FOR BONDING AN ELECTRICALLY CONDUCTIVE WIRE TO BONDING PADS

The invention is directed to a method of and an apparatus for bonding an electrically conductive wire to bonding pads.

For the production of microcircuits and integrated circuits, respectively, it is necessary to make electrical connections between individual circuits on a chip or substrate and external wiring. Normally, thin gold or aluminium wires having a wire size of c 0.25-500 microns at the various bonding pads or areas are used, said bonding pads or areas themselves consisting of thin gold or aluminium films deposited on the substrate and being electrically connected to the respective circuits and the external wiring, respectively.

Securing of the wires by welding is also called bonding, and it is performed under the action of pressure and additionally by energy supply in the form of ultrasonic energy and/or direct thermal energy.

The instant invention mainly relates to a bonding method and a corresponding apparatus, by means of which a thin aluminium wire is welded under the action of pressure and ultrasonic energy to a bonding pad of electric or electronic components, especially semiconductor components etc. When somewhat thicker aluminium wires are used it is necessary to sever the welded or bonded wire section from the remaining aluminium wire by means of a cutting tool associated with the bonding wedge. The cutting tool comprises a severing blade which is effective at a slight spacing from that side of the bonding head or ultrasound-energized wedge acting on the wire which is opposite to the wire feeding side of said wedge. This slight spacing between cutting tool and bonding head or bonding wedge is necessary so that the wedge may vibrate without any detrimental influences acting thereon; i.e., due to this slight spacing or decoupling of the cutting tool from the ultrasonically energized wedge any disturbance of the ultrasonic vibrations of the wedge by the cutting tool is prevented.

However, the above-mentioned spacing between cutting tool and wedge has the drawback that the aluminium wire after having been severed still projects slightly beyond the side of the wedge which is opposite to the wire feeding side. When the bonding pads or areas are sufficiently large, this projecting wire section, which is also called wire tail, has no detrimental effect. With smaller bonding pads it is impossible to prevent contacting of the adjacent bonding pad by the tail and thus a short-circuit condition in the semiconductor component or the like.

It is therefore the object of the instant invention to provide a method and an apparatus of the kind specified above, by means of which short-circuits of the specified kind are reliably prevented.

Due to the measures according to the invention, the formation of a wire tail which bridges various bonding pads is reliably avoided, and the retraction of the bonding wire is preferably performed at the bonding cycle. The invention permits trouble-free bonding, i.e., connecting of at least two bonding pads of a semiconductor component or the like, even if one or both bonding pads have extremely small bonding areas and a minimum relative spacing from each other. The invention also provides a simple way of adjusting the bonding length or varying the same within limits.

Preferred structural improvements of the invention are described and claimed in the subclaims. These are distinguished by minimum design expenditure and highly reliable performance.

Figure 2:
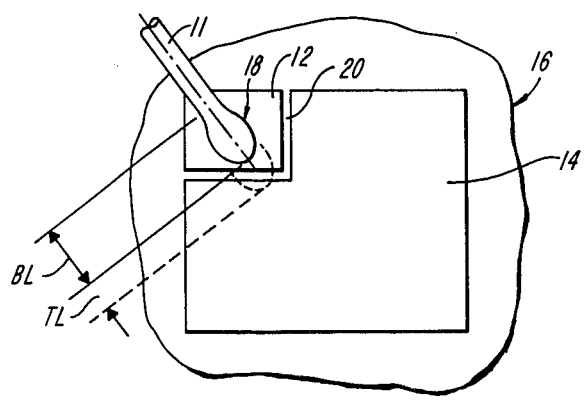

An advantageous embodiment of the invention will be described below with reference to the accompanying drawing, in which:

FIG. 1 is a sectional view of an ultrasonic bonding head or wedge including cutting tool and wire retracting means, the bonding wedge being shown in the wire severing position; and FIG. 2 is a plan view of the bonded terminal area, the bonded wire length being shown for purposes of comparison with and without a wire tail.

With the bonding wedge 10 partially shown in section in FIG. 1 it is possible to secure, or more concretely to weld, an electrically conductive wire 11 such as an aluminium wire to a bonding pad or terminal area 12 or 14 (see FIG. 2) by the action of pressure and ultrasonic energy. To this end a predetermined pressure P, which depends on the wire material and the wire size, is applied to the wedge 10, and moreover the wedge is energized by ultrasonic energy in the direction of the dual arrow U. "Ultrasonic pressing" of the wire 11 against the bonding pad 12 or 14 occurs only for a short period, i.e., in the millisecond range. The described method is known. It is likewise known to provide the wedge 10 with a wire cutting tool in the form of a severing blade 13 reciprocable in the direction of the dual arrow S, said severing blade being disposed on the side 17 of the wedge 10 opposite to the wire feeding side 15 thereof and at a slight spacing "a" from the former side. The severing blade 13 is necessary for ultrasonic bonding of somewhat thicker aluminium wires; somewhat thicker bonding wires will not automatically break during the return movement of the wedge 10 from the bonding location 18 such as happens, for instance, in gold-wire bonding. The severing blade 13 becomes effective in the position shown in FIG. 1, i.e., when the wedge 10 is slightly lifted off the bonding location 18 and is moved further towards the next-following bonding pad. Due to this wedge movement the wire section 19 adjacent the bonding location 18 is bent upwards and away from the bonding pad 12.

The severing blade 13 should be spaced at least slightly from the wedge 10 (spacing "a" in FIG. 1) so that the ultrasonic vibration of the wedge 10 in the direction of the dual arrow U is not affected detrimentally. This means, however, that the bonding wire 11 severed by the severing blade 13 always projects somewhat beyond the face 17 of the wedge 10 and forms a so-called wire tail, which in the next-following bonding operation will become even more distinct due to the deformation of the wire in the bonding region. FIG. 2 shows the tail, which cannot be avoided in conventional bonding of somewhat thicker aluminium wires, with a length TL in broken lines. As will be apparent from FIG. 2, in the case of smaller bonding pads 12 this wire tail may contact the adjacent bonding pad 14, which is electrically isolated (insulation 20) from the first bonding pad, and may result in a short-circuit condition, all the more as this tail is not, like the wire section 19 shown in FIG. 1, bent upwards and away from the bonding pad by the wedge 10.

In order to eliminate this drawback or risk of a short-circuit condition during bonding especially of smaller bonding pads, the invention proposes that wire retracting means is associated with the wedge 10; as shown in FIG. 1, the wire retracting means comprises a wire clamping tool 21 with clamping jaws 22, 23 for engagement with the wire 11, only the upper clamping jaw 23 being reciprocable in the direction of the dual arrow D to be moved cooperatively with the lower clamping jaw 22 from a wire clamping position to a wire releasing position (as shown in FIG. 1), and vice versa. Moreover, the wire clamping tool 21 is adapted for reciprocating movement in the direction of the dual arrow K in parallel relationship with the wire feeding direction Z, the movement of the clamping tool 21 in opposition to the wire feeding direction Z being performed against the action of a resilient element, which in the present case is a tension spring 24 (schematically shown in FIG. 1). By means of the wire clamping tool 21, which is disposed on the wire feeding side of the wedge 10 and follows the motions thereof, the wire 11 may be retracted in opposition to the wire feeding direction Z after the bonded wire section has been severed by the severing blade 13, so that the free wire section is approximately flush with the side 17 of the wedge. Of course, the retraction of the wire has to take place prior to the next-following bonding operation. In this way the formation of a wire tail is prevented, as is shown in FIG. 2, and furthermore the bonding length BL may be varied within limits by retraction of the wire to a greater or lesser extent. Thus, the free end portion of the bonding wire 11 does not extend beyond the bonding length BL of the bonding location 18.

For retracting the wire 11, the clamping jaw 23 is moved into the clamping position and is then moved together with the lower clamping jaw 22 against the action of the tension spring 24 opposite to the wire feeding direction Z by a predetermined amount in accordance with the desired bonding length BL. Therefore, the retraction distance should preferably be adjustable. It is preferred to use a solenoid as the drive means for the retracting movement of the wire clamping tool 21. The movement of the clamping jaw 23 in the direction of the dual arrow D is preferably controlled by a control bar, a control disk or a control lever. Of course, an electromagnetic drive means may likewise be provided therefor.

The lower portion of the wedge 10 facing the components 16 to be bonded is configured in a manner known per se and includes a hole 25, which extends at an inclination to the lower end face of the wedge 10 and to the bonding pads 12 and 14, respectively, and which serves as guide hole for the supplied bonding wire 11; the lower portion further includes a concave or dish-like pressing face 26 by means of which the wire 11 is pressed against the bonding pad 12 or 14 and is locally melted by the superposed ultrasonic vibration in the direction of the dual arrow U in the area BL (effective bonding length) to be welded to the bonding pad.

It is preferred that the wire clamping tool 21 and its drive means are vibration-decoupled relative to the wedge 10. For the rest, however, the wire clamping tool 21 must be reciprocable together with the wedge 10 in order to prevent the wire from bending in the region of the wire feeding side 15 of the wedge 10. To this end, too, the lower clamping jaw 22 is aligned with the hole 25.

All of the features disclosed in the present papers are claimed as being essential to the invention inasmuch as they are novel over the prior art either individually or in combination.

I claim:

1. A method of bonding a thin, electrically conductive wire, especially an aluminium wire, to electrical bonding pads or areas of electric or electronic components, especially microchips or semiconductor components, in which the wire is briefly pressed against the bonding pad by means of an ultrasonically energized wedge and is subsequently severed at a slight spacing from the side of the wedge opposite the wire feeding side thereof by a cutting tool, such that the wire just severed by the cutting tool projects slightly beyond the side of the wedge opposite the wire feeding side, characterized in that after the severing operation and prior to another bonding operation the severed wire is retracted to such an extent that its free end is flush with the side of the wedge oppsoite to the wire feeding side thereof.

2. A method as claimed in claim 1, characterized in that the wire is retracted by a predetermined, adjustable, distance by means of a wire clamping tool disposed on the wedge, on the wire feeding side thereof.

3. An apparatus for bonding a thin, electrically conductive wire, especially an aluminium wire, to electrical bonding pads or areas of electric or electronic components, especially microchips or semiconductor components, comprising an ultrasonically energized wedge for pressing the wire against the bonding pads and a cutting tool disposed on the side of the wedge opposite to the wire feeding side thereof and effective at a small spacing from said side for severing the wire after completion of a bonding operation, such that the wire just severed by the cutting tool projects slightly beyond the side of the wedge opposite the wire feeding side, characterized by means for moving the wire after the severing operation and prior to another bonding operation backwards at least to such an extent that the free wire end is flush with the side of the wedge opposite to the wire feeding side thereof.

4. An apparatus as claimed in claim 3, characterized in that the means for retracting the wire include a wire clamping tool, which is disposed on the wedge, on the wire feeding side thereof, and is reciprocable relative to the wedge in a direction approximately parallel to the wire feeding direction such that during movememnt in wire feeding direction said tool is in a non-clamping or wire releasing position, and during non-movement of the wire said tool is in a clamping position.

5. An apparatus as claimed in claim 4, characterized in that the clamping path of the clamping tool is adjustable.

6. An apparatus as claimed in claim 4 or claim 5, characterized in that the clamping tool includes a clamping jaw and a lower clamping jaw, wherein the clamping jaw is movable between a first location when it is in a clamping position relative to the lower clamping jaw and a second location when it is in a non-clamping position relative to the lower clamping jaw, and means are provided for moving the clamping jaw between the first location and the second location.

7. An apparatus as claimed in claim 6, characterized in that the clamping tool is adapted for movement against the action of a resilient element, in opposition to the wire feeding direction, by means of an electromagnetic drive member.

* * * * *